(12) United States Patent
Ito

(10) Patent No.: US 7,207,653 B2
(45) Date of Patent: Apr. 24, 2007

(54) INK-JET HEAD UNIT

(75) Inventor: Atsushi Ito, Nagoya (JP)

(73) Assignee: Brother Kogyo Kabushiki Kaisha, Nagoya-shi (JP)

( * ) Notice: Subject to any disclaimer, the term of this patent is extended or adjusted under 35 U.S.C. 154(b) by 242 days.

(21) Appl. No.: 10/800,782

(22) Filed: Mar. 15, 2004

(65) Prior Publication Data

US 2004/0183859 A1  Sep. 23, 2004

(30) Foreign Application Priority Data

Mar. 18, 2003 (JP) ............................. 2003-072969

(51) Int. Cl.
*B41J 2/26* (2006.01)

(52) U.S. Cl. ............................. 347/50; 347/57; 347/58

(58) Field of Classification Search .................... 347/50
See application file for complete search history.

(56) References Cited

U.S. PATENT DOCUMENTS 4,488,161 A * 12/1984 Tsutsumi et al. ........... 347/148
4,559,545 A * 12/1985 Iemura et al. ................ 347/55
5,801,728 A *  9/1998 Yanagi et al. ................. 347/50
2003/0160841 A1*  8/2003 Takata et al. ................. 347/50
2004/0094067 A1*  5/2004 Oyanagi et al. ......... 106/31.58

FOREIGN PATENT DOCUMENTS

JP  A-8-32194   2/1996
JP  11034342    2/1999

\* cited by examiner

*Primary Examiner*—Stephen Meier
*Assistant Examiner*—Brian J. Goldberg
(74) *Attorney, Agent, or Firm*—Reed Smith LLP

(57) ABSTRACT

An ink-jet head unit including an ink-jet head having ejection-energy generating elements for generating energies for ejecting an ink from nozzles, and a row of terminals for energizing the ejection-energy generating elements, a flexible wiring board having a wiring pattern jointed in an end portion thereof to the terminals of the ink-jet head, the flexible wiring board extending in a direction perpendicular to a direction of extension of the row of terminals, and including an inclined portion extending from the end portion obliquely upwardly and outwardly of the ink-jet head, and a rigid member having a higher degree of rigidity than the flexible wiring board and disposed on the flexible wiring board in contact with at least the end portion.

17 Claims, 6 Drawing Sheets

INK-JET HEAD UNIT

The present application is based on Japanese Patent Application No. 2003-072969 filed Mar. 18, 2003, the contents of which are incorporated herein by reference.

BACKGROUND OF THE INVENTION

1. Field of the Invention

The present invention relates in general to an ink-jet recording apparatus, and more particularly to an ink-jet head unit of the ink-jet recording apparatus, which is provided with an ink-jet head and a flexible wiring board.

2. Discussion of Related Art

A known ink-jet recording apparatus uses four ink cartridges for cyan, magenta, yellow and black inks, for example, to perform a color printing operation. These ink cartridges are held by a head holder, which carries four ink-jet heads for ejecting the inks of the respective four colors, and circuit boards for driving these ink-jet heads. Each of the ink-jet heads and the corresponding circuit board are connected to each other through a flexible wiring board, to form an ink-jet head unit. Each ink-jet head is supplied with the corresponding color ink delivered from the corresponding ink cartridge, so that the ink is ejected from nozzles of the ink-jet head, to form a desired image on a recording medium.

The flexible wiring board is an electrically insulating flexible film of a generally rectangular shape having a wiring pattern including a multiplicity of conductive wires extending in its longitudinal direction. The flexible wiring board is widely used to install complicated electronic circuits in a relatively small space. In the ink-jet recording apparatus, the electrical connection between the ink-jet head and the flexible wiring board is made by soldering or otherwise joining the terminals of the ink-jet head and the terminal lands of the flexible wiring board to each other The soldered or otherwise joined portion of the ink-jet head unit has a comparatively low mechanical strength in the direction of separation of the terminals, and tends suffer from a risk of poor or faulty electrical connection or electrical discontinuity at the joined portion due to the separation or removal of the terminals and the terminal lands from each other, which separation takes place when a force acts between the ink-jet head and the flexible wiring board, in the direction of removal of the flexible wiring board from the ink-jet head. To prevent this drawback, a suitable reinforcement is conventionally provided to sandwich the joined portion, so as to increase the mechanical strength of the jointed portion in the direction of removal. Alternatively, small holes are formed through the flexible wiring board, so that these small holes are filled with a surplus amount of the molten solder, which is eventually solidified to reinforce the jointed portions. An example of this technique is disclosed in JP-8-32194A.

In the ink-jet head unit, however, the circuit board is disposed in an upper part of the ink-jet head, so that the flexible wiring board which connects the circuit board and the ink-jet head must be oriented such that a non-joined portion of the flexible wiring board at which the flexible wiring board is not joined to the ink-jet head extends obliquely upwardly from the ink-jet head toward the circuit board. In this orientation, the flexible wiring board tends to suffer from a problem of stress concentration at the corresponding ends of the joined and non-joined portions, and consequent separation of the joined portion from the ink-jet head

SUMMARY OF THE INVENTION

The present invention was made in an effort to solve the problem indicated above. It is therefore a first object of the present invention to provide an ink-jet head unit in which the flexible wiring board is less likely to separate from the ink-jet head.

The first object indicated above may be achieved according to the principle of this invention, which provides an ink-jet head unit comprising:

an ink-jet head having a plurality of ejection-energy generating elements for generating energies for ejecting an ink from a plurality of nozzles, and a row of terminals exposed on a surface thereof for energizing the plurality of ejection-energy generating elements;

a flexible wiring board having a wiring pattern joined in an end portion thereof to the row of terminals of the ink-jet head, the flexible wiring board extending in a direction perpendicular to a direction of extension of the row of terminals, and including an inclined portion extending from its end portion obliquely upwardly and outwardly of the surface of the ink-jet head; and a rigid member having a higher degree of rigidity than the flexible wiring board and disposed on the flexible wiring board in contact with at least the end portion of the board.

In the ink-jet head unit of the present invention constructed as described above, the wiring pattern formed in the end portion of the flexible wiring board is joined to the row of terminals of the ink-jet head. The rigid member having a higher degree of rigidity than the flexible wiring board is held in contact with the end portion of the flexible wiring board, so that the flexible wiring board can be easily bent at a position near the end of its end portion such that the inclined portion not reinforced by the rigid member extends obliquely upwardly from the end of the end portion, without deformation of the end portion which is reinforced by the rigid member.

In one preferred form of the ink-jet head unit of the present invention, the rigid member includes an overhang portion located between the inclined portion and a joined portion of the wiring pattern and the terminals. Since the rigid member includes an overhang portion located between the inclined portion and the joined portion, the wiring pattern and the terminals are effectively freed from a stress concentration upon bending of the flexible wiring board at the position near the distal end of the overhang portion. In the presence of the rigid member including the overhang portion, the wiring pattern and the terminals are protected from undesirable separation from each other.

In another preferred form of the ink-jet head unit, the rigid member is a planar member in contact with a surface area of the flexible wiring board which is larger than that of the joined portion of the wiring pattern and the terminals.

In a further preferred form of the ink-jet head unit, the rigid member includes an easily deformable portion which is located at a distal end of the overhang portion and which is more easily deformable in a direction of extension of the inclined longitudinal portion of the flexible wiring board, than a portion of the rigid member which corresponds to the joined portion of the wiring pattern and the terminals.

In one advantageous arrangement of the above-indicated preferred form of the invention. the easily deformable portion is a thin-walled portion having a smaller thickness than the other portion of the rigid member, the thin-walled portion being formed at a position at which the flexible wiring board is bent to form the inclined portion.

In a still further preferred form of the ink-jet head unit, the rigid member is a cured mass of an adhesive agent applied to a surface of the flexible wiring board which is opposite to a surface having the wiring pattern.

In one advantageous arrangement of the above-indicated preferred form of the invention, the cured mass of the adhesive agent includes an inner portion in the form of a lattice located within the joined portion of the wiring pattern and the terminals.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which:

FIG. 6A is a plan view showing a connection between a connection between the ink-jet head and the flexible wiring board according to a third embodiment of this invention, while

DETAILED DESCRIPTION OF THE PREFERRED EMBODIMENTS

Figure 1:
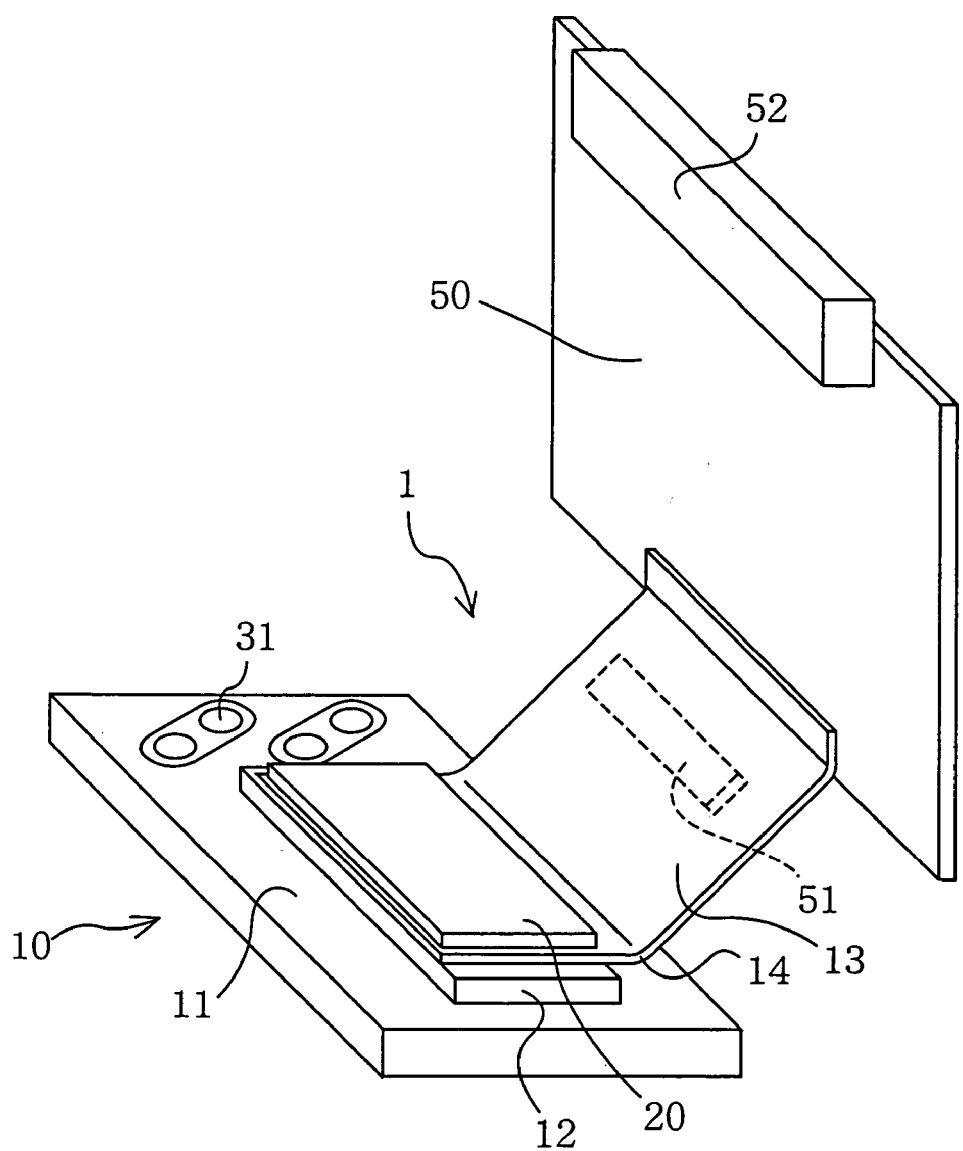
FIG. 1 is a perspective view showing an ink-jet head unit 1 and a junction circuit board that are connected to each other.

Referring first to the perspective view of FIG. 1, there is shown an ink-jet head unit 1 constructed according to one embodiment of this invention. The ink-jet head unit 1 consists of an ink-jet head 10, and a flexible wiring board 13 which is electrically connected to the ink-jet head 10 and a junction circuit board 50.

Figure 3:
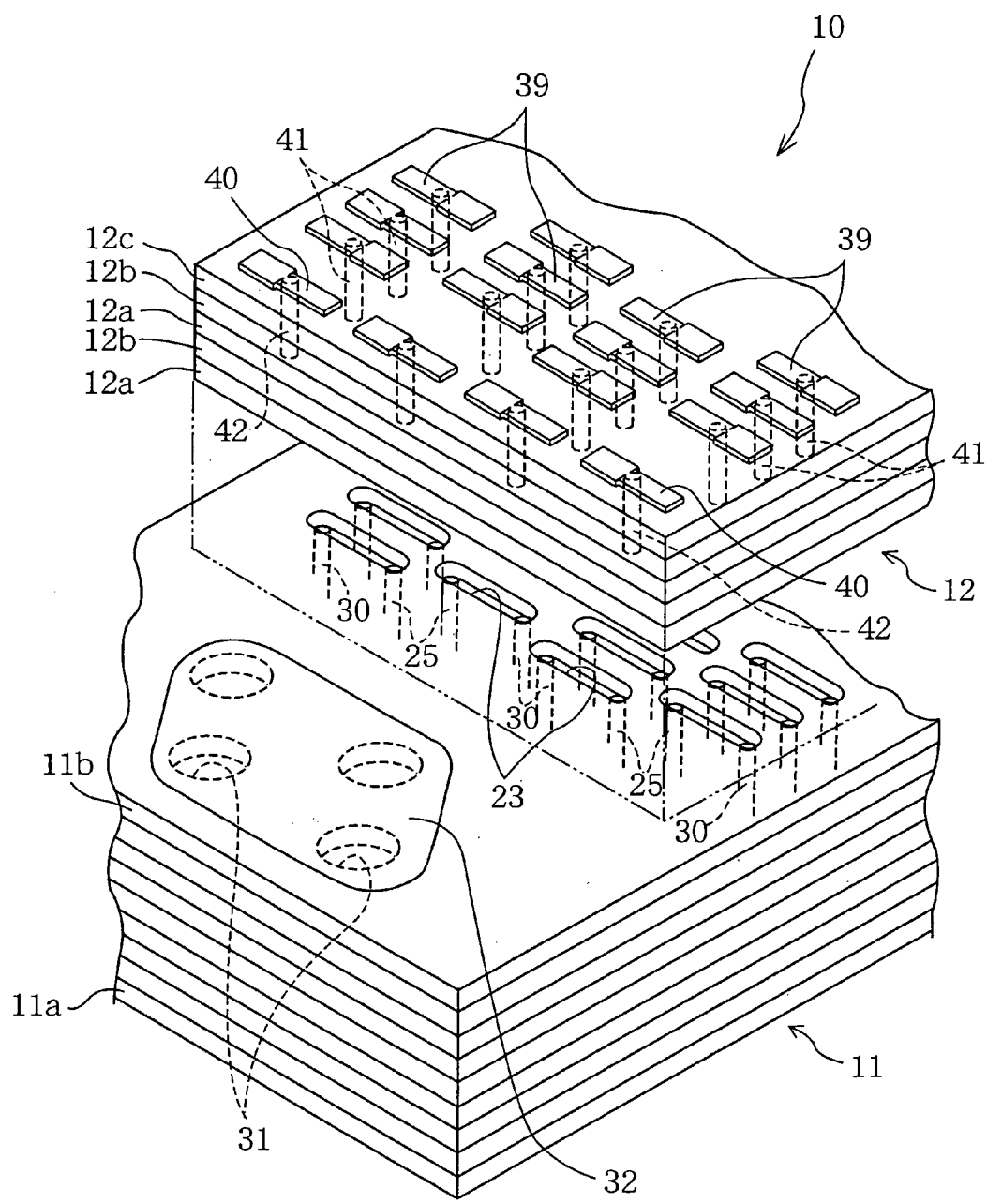
FIG. 3 is a perspective view showing a portion of the ink-jet head in enlargement.

In the ink-jet head unit 1 shown in FIG. 3, the flexible wiring board 13 is electrically connected or jointed at one of its opposite end portions to the ink-jet head 10 such that the upper surface of the ink-jet head 10 is covered by that end portion (first end portion) of the flexible wiring board 13. As described below in detail, the flexible wiring board 13 includes an inclined portion between the above-indicated first end portion connected to the ink-jet head 10, and the other end portion (second end portion) electrically connected or joined to the junction circuit board 50.

Figure 2:
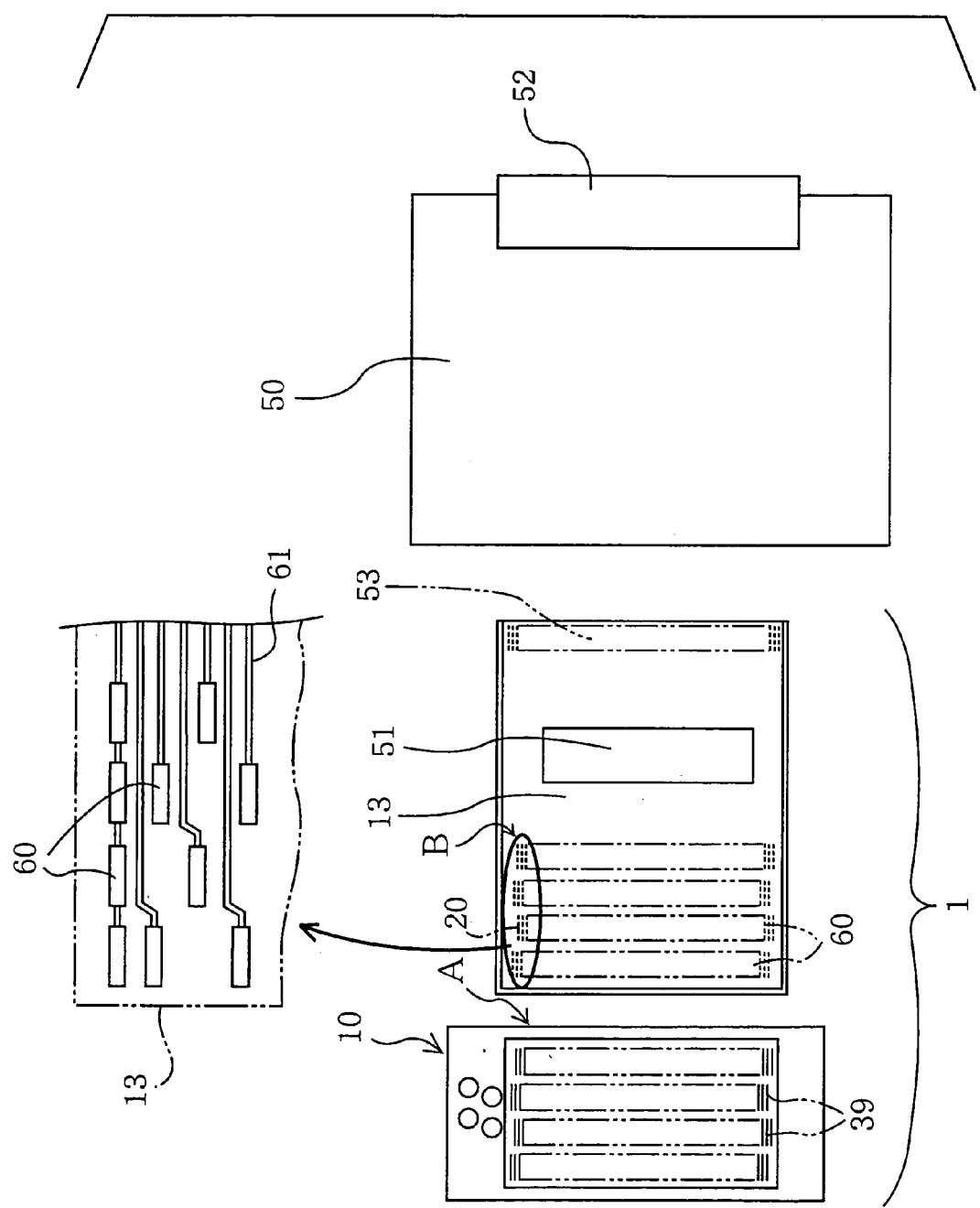
FIG. 2 is a plan view showing an ink-jet head, a flexible wiring board and the junction circuit board, wherein a portion of the flexible wiring board which lies within an ellipse shown is enlarged to illustrate terminal lands and conductors.

As shown in FIG. 2, the ink-jet head 10 has a generally rectangular shape as viewed in the plan view of the figure, and includes a cavity unit 11 constituted by a laminar structure of generally rectangular metallic plates, and a piezoelectric actuator 12 disposed on the cavity unit 11, as shown in FIG. 3 and as described below in detail. The flexible wiring board 13 has a width almost equal to the length (longitudinal dimension) of the piezoelectric actuator 12 of the ink-jet head 10, and extends in its longitudinal direction perpendicular to the direction of its width, from the above-indicated first end portion electrically connected to the piezoelectric actuator 12. At the other or second end portion of the flexible wiring board 13 remote from the first end portion, there is provided a terminal portion 53 which extends in the direction of width, for electrical connection with the junction circuit board 50. The flexible wiring board 13 also has a driver IC 51 operable to control a drive voltage to be applied to the ink-jet head 10. The junction circuit board 50, which also has a generally rectangular shape, is electrically connected at one of its opposite ends to the terminal portion 53 of the flexible wiring board 13, and has a connector 52 located at the other end. The junction circuit board 50 is electrically connected at the connector 53 to a control circuit (not shown) of the ink-jet recording apparatus.

As shown in FIG. 3, the cavity unit 11 of the ink-jet head 10 includes nine plates superposed on each other. A lowermost plate 11a of the nine plates is formed of a synthetic resin. The lowermost plate 11a has four parallel rows of nozzles (not show) extending in its longitudinal direction. The nozzles are arranged such that the nozzles of the adjacent first and second rows are positioned in a zigzag fashion, while the nozzles of the adjacent third and fourth rows are similarly positioned in a zigzag fashion. An uppermost metal plate 11b of the nine plates has a multiplicity of pressure chambers 23 which are arranged in four parallel rows corresponding to the respective four rows of nozzles such that the rows of the pressure chambers 23 extend in the longitudinal direction of the metallic plate 11b and the nozzles of the adjacent rows are positioned in a zigzag fashion. The pressure chambers 23 are communicated with the respective nozzles through respective communication passages 25. Each of the pressure chambers 23 in each row is communicated at one of its opposite longitudinal ends with the corresponding communication passage 25, and has a predetermined length in the transverse direction of the metallic plate 11b (in the direction perpendicular to the rows of the pressure chambers 23). Each pressure chamber 23 is communicated, at the other longitudinal end remote from the communication passage 25, with an ink passage 30 which is held in communication with a corresponding one of four manifolds (not shown) that are formed in some of the plates between the lowermost and uppermost plates 11a, 11b such that the four manifolds extend in the longitudinal direction of the cavity unit 11 and correspond to the respective four rows of pressure chambers 23. The cavity unit 11 has four ink supply holes 31 formed in one of its longitudinal opposite end portions. Each of the ink supply holes 31 is open, at one of its opposite ends, in the upper surface of the uppermost metal plate 11b, and is communicated at the other end with the corresponding one of the four manifolds, so that the manifolds are filled with the inks of the respective four colors through the ink supply holes 31. The open ends of the ink supply holes 31 are covered by a filter 32 provided on the upper surface of the uppermost plate 11b.

As also shown in FIG. 3, the piezoelectric actuator 12 includes a plurality of piezoelectric sheets 12a and a plurality of piezoelectric sheets 12b which are alternately superposed on each other, and an uppermost piezoelectric sheet 12c bonded to a laminar structure of the piezoelectric sheets 12a, 12b. Each piezoelectric sheet 12a has a plurality of drive electrodes (not shown) corresponding to the respective pressure chambers 23 described above, while each piezoelectric sheet 12b has a grounding electrode (not shown) covering its entire surface area except those regions in which through-holes 41 are formed. Each of the drive electrodes is electrically connected, through the corresponding through-hole 41 coated with a conductive material, to a corresponding one of terminals 39 formed on the upper surface of the piezoelectric sheet 12*c*. The grounding electrode formed on each piezoelectric sheet 12*b* is electrically connected, through a through-hole 42 coated with a conductive material, to a corresponding one of terminals 40 also formed on the upper surface of the piezoelectric sheet 12*c*. The terminals 39, 40 are arranged in four parallel rows parallel to the four parallel rows of pressure chambers 23 extending in the longitudinal direction of the piezoelectric actuator 12. The terminals 39 of the adjacent first and second rows are positioned in a zigzag fashion, like the pressure chambers 23. Thus, the piezoelectric actuator 12 includes a plurality of ejection-energy generating elements for generating energies to eject an ink from a plurality of nozzles, and a plurality of rows of terminals exposed on the upper surface of the uppermost piezoelectric sheet 12*c*, for energizing the ejection-energy generating elements.

The flexible wiring board 13 has a well known structure formed of an electrically insulating flexible material in the form of a rectangular polyimide film having a wiring pattern formed by etching a copper foil bonded to one of its opposite surfaces. A portion of the wiring pattern is illustrated in enlargement in FIG. 2, by way of example. In one of the opposite longitudinal end portions of the insulating film of the flexible wiring board 13, there are formed terminal lands 60 at positions corresponding to the terminals 39, 40 formed on the piezoelectric actuator 12. The terminal lands 60 are respectively formed at end portions of mutually independent conductive wires 61 that form the wiring pattern. The conductive wires 61 are positioned such that the terminal lands 60 in the adjacent rows corresponding to the adjacent rows of the terminals 39 are arranged in a zigzag fashion, like the terminals 39. Each conductive wire 61 is electrically connected, at the other end portion remote from the terminal land 60, to a corresponding one of terminals in the terminal portion 53 disposed at the other longitudinal end portion of the rectangular electrically insulating film of the flexible wiring board 13. The terminals in the terminal portion 53 are arranged in the transverse direction of the rectangular film.

Figure 4:
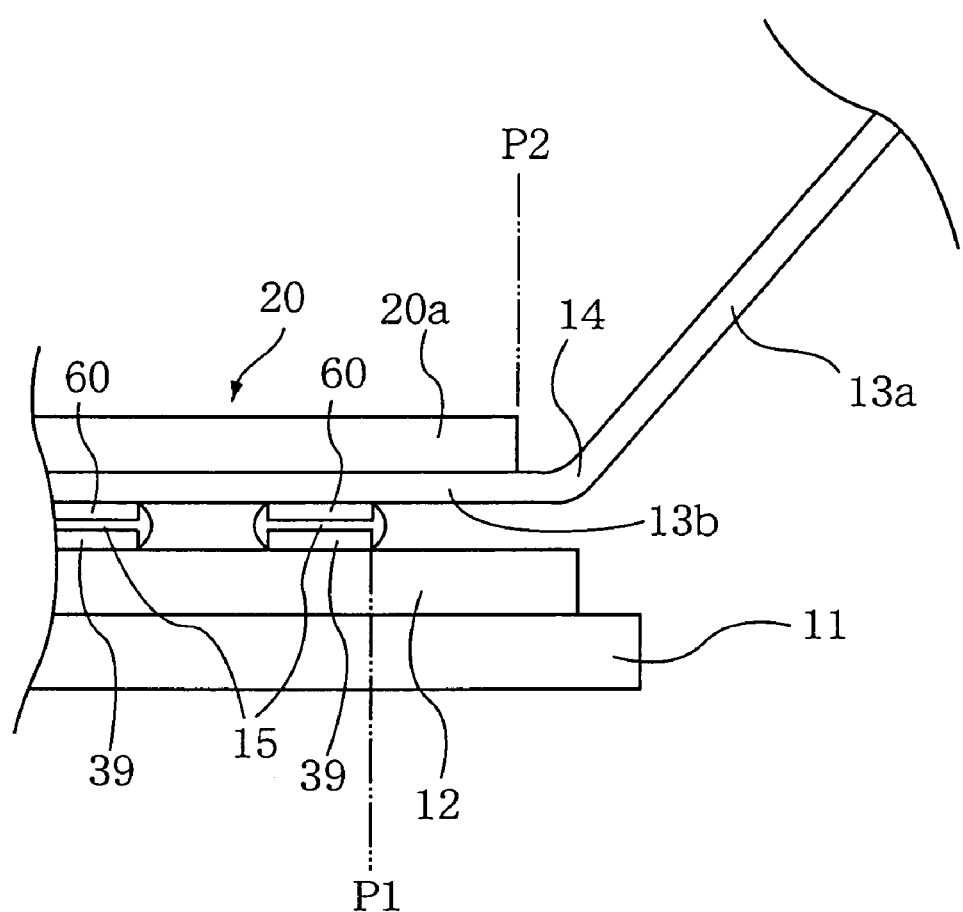
FIG. 4 is a fragmentary side elevational view showing a connection between the ink-jet head and the flexible wiring board according to a first embodiment of this invention.

The flexible wiring board 13 is disposed on the ink-jet head 10 such that the terminals 39, 40 of the piezoelectric actuator 12 are aligned with the terminal lands 60 of the flexible wiring board 13, and such that masses of electrically conductive soldering material such as solder 15 are interposed between the corresponding terminals 39, 40 and lands 60, as indicated in FIG. 4. Thus, the ink-jet head 10 and the flexible wiring board 13 are joined together with the terminals 39, 40 being soldered to the terminal lands 60. In the ink-jet head unit 1 having the thus joined ink-jet head 10 and the flexible wiring board 13, the flexible wiring board 13 extends in its longitudinal direction perpendicular to the direction of extension of the four rows of terminals 39, 40, and includes an inclined longitudinally intermediate portion 13*a*, which extends obliquely upwards from the longitudinal end portion 13*b* joined to the inkjet head 10, in a direction away from the lower surface of the ink-jet head 10 in which the nozzles are open, as shown in FIG. 4.

As shown in FIGS. 1 and 4, the flexible wiring board 13 is provided with a rigid member 20 in the form of a rectangular plate on the upper surface of its longitudinal end portion 13*b* electrically connected or joined to the piezoelectric actuator 12 of the ink-jet head 10. This rigid member 20 is formed of polyethylene terephthalate (PET) or any other synthetic resin material, a metallic material or any other suitable material which has a high degree of rigidity than the electrically insulating material of the flexible wiring board 13.

The rigid member 20 is bonded or otherwise fixed to the upper surface of the above-indicated longitudinal end portion 13*b* of the flexible wiring board 13, such that the rigid member 20 in the form of the rectangular plate is in contact with a surface area of the flexible wiring board 13 which is larger than a surface area of the piezoelectric actuator 12 in which the four rows of terminals 39, 40 are located. The rigid member 20 is positioned relative to the flexible wiring board 13 such that one widthwise end P2 of the rectangular plate of the rigid member 20 is spaced from one widthwise end P1 of the rightmost row of terminals 39, 40 toward the terminal portion 53 for electrical connection with the junction circuit board 50, as shown in FIG. 4. Thus, the rigid member 20 includes an overhang portion 20*a* located between the ends P1, P2, that is, between the inclined portion 13*a* and a joined portion of the terminals 39, 40 and the terminal lands 60. The overhang portion 20*a* makes it possible to bend the flexible wiring board 13 at a position more or less spaced from the end P2 outwardly of the rigid member 20 in a direction away from the end P1, so that the other longitudinal portion 13*a* of the flexible wiring board 13 extends obliquely upwards from the bend. This arrangement effectively protects the solder masses 15 from a force which would act on the solder masses 15 in a direction that causes separation of the solder masses 15 from the terminals 39, 40 and/or the terminal lands 60, when the flexible wiring board 13 is bent at the above-indicated position. To more effectively protect the solder masses 15, it is desirable to provide the rigid member 20 with similar overhang portions on the other widthwise end opposite to the end P2, and on the opposite lengthwise ends of its rectangular plate corresponding to the opposite longitudinal ends of each row of terminals 39, 40.

Figure 5:
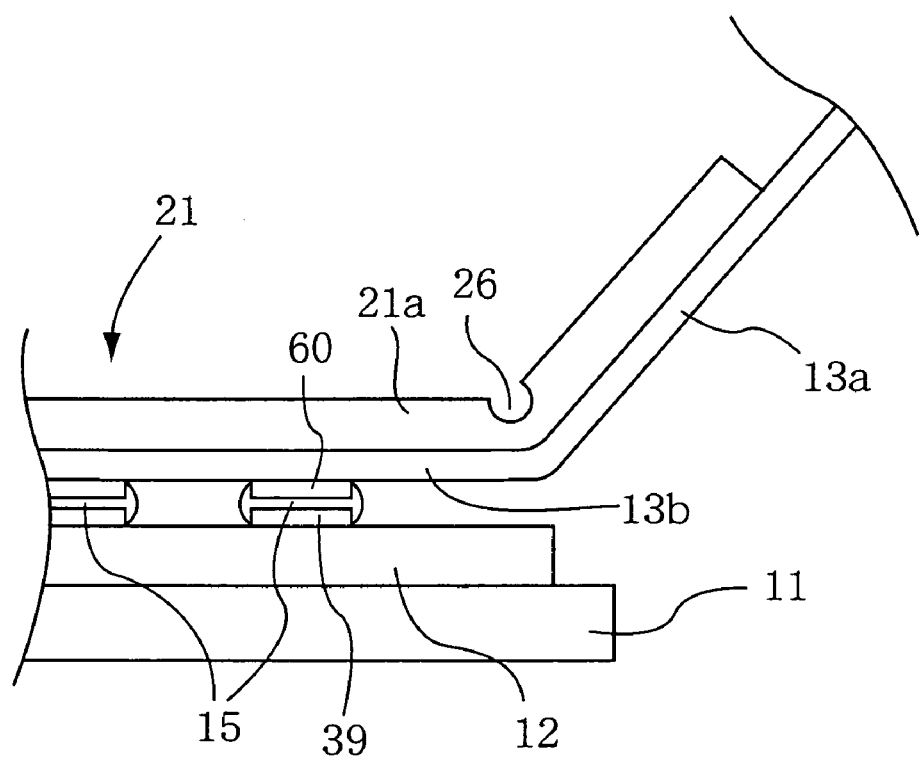
FIG. 5 is a fragmentary side elevational view showing a connection between the ink-jet head and the flexible wiring board according to a second embodiment of this invention.

Referring next to FIG. 5, there will be described an ink-jet head unit provided with a rigid member 21 according to a second embodiment of this invention. This rigid member 21 has an easily deformable portion in the form of a thin-walled portion 26 at the distal end of an overhang portion 21*a*, and is formed of a resin material. The rigid member 21 has a larger width than the rigid member 20 in the first embodiment of FIG. 4 and is fixed to the flexible wiring board 13 such that the thin-walled portion 26 is spaced a suitable distance from the widthwise end P1 of the rightmost row of terminals 39, 40 in the direction toward the terminal portion 53. In the presence of this thin-walled portion 26 which has a smaller thickness and is more easily deformable than the other portion of the rigid member 21, the flexible wiring board 13 can be easily bent at the thin-walled portion 26, such that the longitudinal portion 13*a* of the flexible wiring board 13 other than the longitudinal end portion 13*b* corresponding to the piezoelectric actuator 13 extends obliquely upwards towards the junction circuit board 50. Thus, the thin-walled portion 26 determines the position of the bend of the flexible wiring board 13, so that the rigid member 21 effectively protects the solder masses 15 from being separated from the terminals 39, 40 of the piezoelectric actuator 12 and/or the terminal lands 60 of the flexible wiring board 13. The end portion of the rigid member 21 on one side of the thin-walled portion 26 remote from the piezoelectric actuator 12 may have a thickness that gradually decreases in the direction toward its end on the side of the terminal portion 53.

Figure 6A:
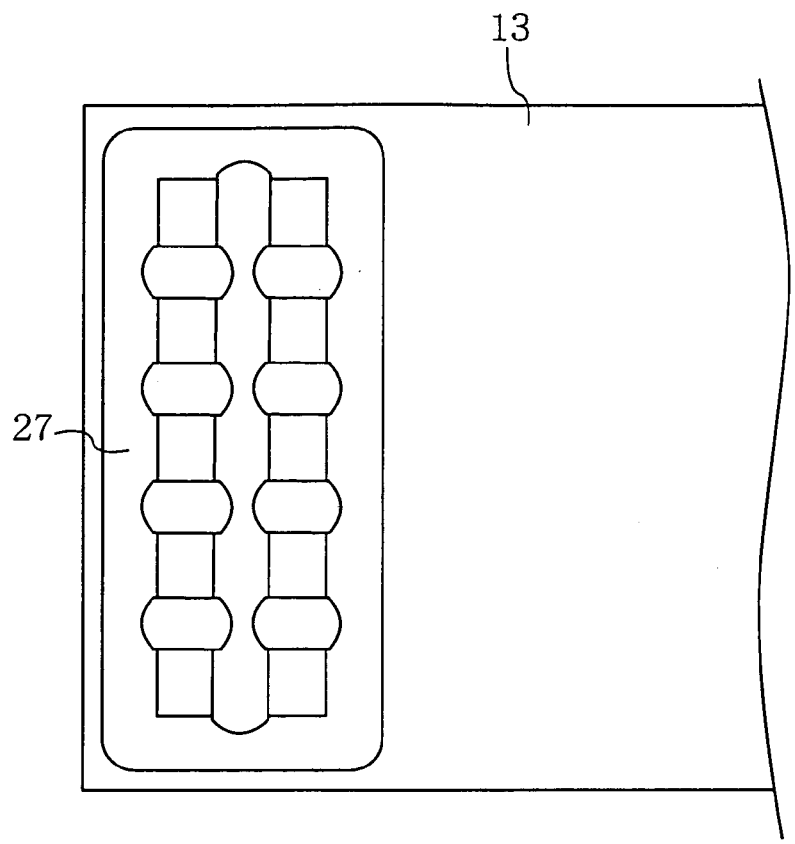
Figure 6B:
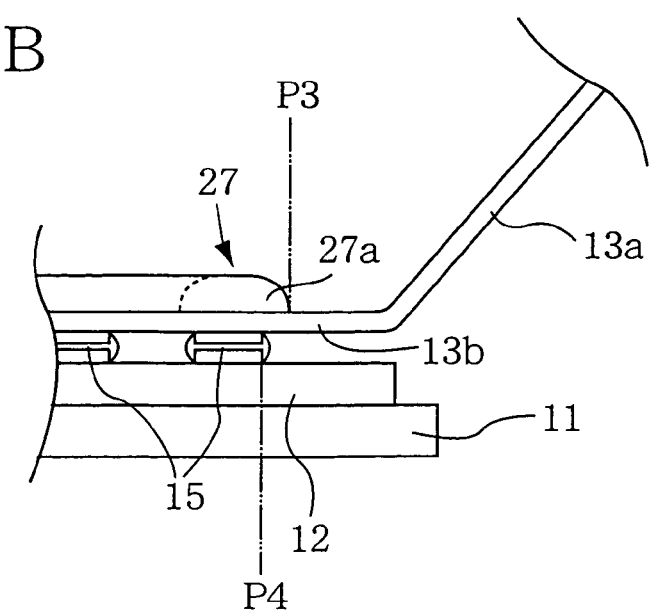
FIG. 6B is a fragmentary side elevational view of the connection.

Reference is now made to FIGS. 6A and 6B, there is shown a rigid member in the form of a cured or solidified mass of adhesive agent 27. Described more specifically, the upper surface of the longitudinal end portion 13b of the flexible wiring board 13 is coated with a suitable pattern of a UV-curable adhesive agent, which is rapidly curable by exposure to an ultraviolet radiation. Preferably, the adhesive agent before application onto the flexible wiring board 13 has a viscosity that facilitates formation of the pattern of the adhesive agent having a desired thickness, without spreading flows of the adhesive agent. To form the pattern of the adhesive agent on the longitudinal end portion of the flexible wiring board 13, the adhesive agent is initially applied in the form of a substantially rectangular annular frame having a desired thickness, such that an outer periphery P3 of the annular frame encloses a rectangular area of formation of the terminals 39, 40 on the piezoelectric actuator 12, as shown in FIG. 6B wherein P4 represents the periphery of the rectangular area in which the terminals 39, 40 (and terminal lands 60) are located. Subsequently, the adhesive agent is applied to an inner portion in the form of a grid or lattice within the annular frame. The thus formed pattern of the adhesive agent is cured by exposure to a ultraviolet radiation. The cured mass of adhesive agent 27 has a higher degree of rigidity that the flexible wiring board 13. In the presence of the cured mass of adhesive agent 27 including an overhang portion 27a the outer periphery P3 of which is larger than the rectangular area of formation of the terminals 39, 40 and lands 60, the flexible wiring board 13 can be easily bent at a position near and outwardly of the outer periphery P3, such that the other longitudinal portion of the flexible wiring board 13 obliquely upwards. The rigid member in the form of the cured adhesive agent 27 is also effective to prevent separation of the solder masses 15 from the terminals 39, 40 and/or the terminal lands 60. The grid structure of the adhesive agent increases the rigidity of the entire pattern of the adhesive agent, and permits the applied mass of adhesive agent to function as a rigid member. The present embodiment eliminates a need of manufacturing a separate rigid member.

In the first and second embodiments of FIGS. 4 and 5, the rigid member 20, 21 is a planar member in contact with a surface area of the flexible wiring board 13 which is larger than the area of formation of the wiring pattern 61. This arrangement increases the rigidity of the rigid member 20, 21, and assures that the flexible wiring board is bent at a position which is adjacent to the distal end of the overhang portion 20a, 21a, rather than to the end of the area of formation of the wiring pattern 61 on the side of the overhang portion 20a, 21a.

In the second embodiment of FIG. 5, the rigid member 21 includes the easily deformable portion at the distal end of the overhang portion 21a. The easily deformable portion permits the flexible wiring board to be bent at this easily deformable portion, to form the inclined longitudinal portion which extends obliquely upwardly from the end of the longitudinal end portion 13b. In other words, the position of the easily deformable portion determines the position at which the flexible wiring board is bent to form the inclined longitudinal portion 13a.

Described more specifically, the rigid member 21 provided in the second embodiment includes the easily deformable portion in the form of the thin-walled portion 26 which has a smaller thickness than the other portion and which is formed at a position at which the flexible wiring board 13 is bent to form the inclined longitudinal portion 13a. In other words, the thin-walled portion 26 which is formed at the distal end of the overhang portion 21a determines the position at which the flexible wiring board 13 is bent to form the inclined longitudinal portion 13a.

In the third embodiment of FIGS. 6A and 6B, the rigid member is constituted by the cured mass of the adhesive agent 27 applied to the surface of the flexible wiring board opposite to the surface having the wiring pattern 61. The adhesive agent 27 may be a UV-curable adhesive agent which is cured by exposure to an ultraviolet radiation, so as to have rigidity higher than the flexible wiring board 13. This embodiment does not require a separate rigid member, and permits easy formation of the rigid member on the flexible wiring board.

The cured mass of the adhesive agent 27 includes an inner portion in the form of a lattice or grid located within the area of formation of the wiring pattern 61 (area formation of the terminals 39, 40 on the piezoelectric actuator 12). The lattice increases the rigidity of the rigid member to a value comparable to that of a separate solid rigid member fixed to the flexible wiring board.

What is claimed is:

1. An ink-jet head unit comprising:
an ink-jet head having a plurality of ejection-energy generating elements for generating energies for ejecting an ink from a plurality of nozzles, and a row of terminals exposed on a surface thereof for energizing said plurality of ejection-energy generating elements;
a flexible wiring board having a wiring pattern jointed on one side of an end portion thereof to said row of terminals of said ink-jet head,.said flexible wiring board extending in a direction perpendicular to a direction of extension of said row of terminals, and including an inclined portion extending from said end portion obliquely upwardly and outwardly of said surface of said ink-jet head; and
a rigid member having a higher degree of rigidity than said flexible wiring board and disposed on said flexible wiring board in contact with at least said end portion, on a side of said end portion opposite to that which is jointed to said row of terminals.

2. An ink-jet head unit comprising:
an ink-jet head having a plurality of ejection-energy generating elements for generating energies for ejecting an ink from a plurality of nozzles, and a row of terminals exposed on a surface thereof for energizing said plurality of ejection-energy generating elements;
a flexible wiring board having a wiring pattern jointed in an end portion thereof to said row of terminals of said ink-jet head, said flexible wiring board extending in a direction perpendicular to a direction of extension of said row of terminals, and including an inclined portion extending from said end portion obliquely upwardly and outwardly of said surface of said ink-jet head; and
a rigid member having a higher degree of rigidity than said flexible wiring board and disposed on said flexible wiring board in contact with at least said end portion. on a side of said end portion opposite to that which is jointed to said row of terminals.

3. The ink-jet head unit according to claim 2, wherein said rigid member includes an overhang portion located between said inclined portion and a joined portion of said wiring pattern and said terminals.

4. The ink-jet head unit according to claim 2, wherein said rigid member is a planar member in contact with a surface area of said flexible wiring board which is larger than that of said joined portion of said wiring pattern and said terminals.

5. The ink-jet head unit according to claim 2, wherein said rigid member includes an easily deformable portion which is located at a distal end of said overhang portion and which is more easily deformable in a direction of extension of said inclined portion of said flexible wiring board, than a portion of said rigid member which corresponds to said jointed portion of said wiring pattern and said terminals.

6. The ink-jet head unit according to claim 5, wherein said easily deformable portion is a thin-walled portion having a smaller thickness than the other portion of said rigid member, said thin-walled portion being formed at a position at which said flexible wiring board is bent to form said inclined portion.

7. The ink-jet head unit according to claim 2, wherein said rigid member is a cured mass of an adhesive agent applied to a surface of said flexible wiring board which is opposite to a surface having said wiring pattern.

8. The ink-jet head unit according to claim 7, wherein said cured mass of the adhesive agent includes an inner portion in the form of a lattice located within said joined portion of said wiring pattern and said terminals.

9. The ink-jet head unit according to claim 8, wherein said adhesive agent is a UV-curable adhesive resin curable by exposure to an ultraviolet radiation.

10. The ink-jet head unit according to claim 2, wherein said rigid member is formed of a synthetic resin.

11. The ink-jet head unit according to claim 10, wherein said synthetic resin includes polyethylene terephthalate.

12. The ink-jet head unit according to claim 2, wherein said rigid member is formed of a metallic material.

13. The ink-jet head unit according to claim 2, wherein said flexible wiring board is a rectangular board including a longitudinal end at which said wiring pattern is joined to said row of terminals of said ink-jet head.

14. The ink-jet head unit according to claim 2, wherein said wiring pattern has a plurality of conductive wires which extend in the direction perpendicular to said direction of extension of said row of terminals and each of which has a terminal land at one end thereof, said conductive wires being connected to said terminals through the terminal lands.

15. The ink-jet head unit according to claim 2, wherein said rigid member is a rectangular member bonded to said flexible wiring board.

16. The ink-jet head unit according to claim 2, wherein said flexible wiring board includes an electrically insulating flexible film on which said wiring pattern is formed.

17. The ink-jet head unit according to claim 16, wherein said electrically insulating flexible film is a polyimide film.

* * * * *